(12) United States Patent
Liu et al.

(10) Patent No.: US 8,664,070 B2
(45) Date of Patent: Mar. 4, 2014

(54) HIGH TEMPERATURE GATE REPLACEMENT PROCESS

(75) Inventors: Chung-Shi Liu, Shin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 141 days.

(21) Appl. No.: 12/643,279

(22) Filed: Dec. 21, 2009

(65) Prior Publication Data

US 2011/0151635 A1    Jun. 23, 2011

(51) Int. Cl.
*H01L 21/336*    (2006.01)

(52) U.S. Cl.
USPC ............................................. 438/301

(58) Field of Classification Search
USPC ............................................. 438/301
See application file for complete search history.

(56) References Cited

U.S. PATENT DOCUMENTS

| | | | | |
|---|---|---|---|---|
| 5,618,761 A * | 4/1997 | Eguchi et al. | ................. | 438/785 |
| 6,743,682 B2 * | 6/2004 | Woerlee et al. | ................. | 438/291 |
| 2002/0094647 A1 * | 7/2002 | Woerlee et al. | ................. | 438/289 |
| 2006/0006476 A1 * | 1/2006 | Biery et al. | ................. | 257/382 |
| 2007/0034967 A1 * | 2/2007 | Nayfeh et al. | ................. | 257/369 |
| 2008/0009110 A1 * | 1/2008 | Chang et al. | ................. | 438/197 |
| 2008/0064172 A1 * | 3/2008 | Doris et al. | ................. | 438/296 |
| 2010/0164002 A1 * | 7/2010 | Golonzka et al. | ............. | 257/369 |
| 2010/0270627 A1 * | 10/2010 | Chang et al. | ................. | 257/411 |

OTHER PUBLICATIONS

C. Detavernier et al., "Kinetics of Agglomeration of NiSi and NiSi2 Phase Formation", Mat. Res. Soc. Symp. Proc. vol. 745, 2003, Materials Research Society, N4.12.1-N4.12.6.
James Pan et al., "Replacement Metal-Gate NMOSFETs with ALD TaN/EP-Cu PVD Ta, and PVD TaN Electrode", Advanced Micro Devices, Inc., Sunnyvale, CA, Applied Materials, Inc., Santa Clara, CA, 12 pages, May 2003.
James Pan et al., "Replacement Metal-Gate NMOSFETs with ALD TaN/EP-Cu PVD Ta, and PVD TaN Electrode", IEEE Electron Device Letters, vol. 24, No. 5, May 2003, 0741-3106/03, 2 pages.

* cited by examiner

*Primary Examiner* — Shaun Campbell
(74) *Attorney, Agent, or Firm* — Haynes and Boone, LLP

(57) ABSTRACT

A method for fabricating an integrated circuit device is disclosed. An exemplary method comprises performing a gate replacement process to form a gate structure, wherein the gate replacement process includes an annealing process; after the annealing process, removing portions of a dielectric material layer to form a contact opening, wherein a portion of the substrate is exposed; forming a silicide feature on the exposed portion of the substrate through the contact opening; and filling the contact opening to form a contact to the exposed portion of the substrate.

20 Claims, 9 Drawing Sheets

HIGH TEMPERATURE GATE REPLACEMENT PROCESS

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

The continuing decrease in technology nodes has lead to a desire to replace a conventional polysilicon gate electrode with a metal gate electrode to improve device performance. One process for forming a metal gate structure (i.e., having a metal gate electrode) is referred to as a "gate last" process, where a final gate stack is fabricated last. This reduces the number of subsequent processes, including high temperature processing, that must be performed after formation of the gate structure. However, there are challenges to implementing such features and processes in conventional fabrication. As the gate length and spacing between devices decreases, these problems are exacerbated. For example, conventional gate replacement processes have limited thermal budgets, which limits flexibility in metal gate work function tuning. The limited thermal budgets can arise because contact features (e.g., silicide regions of source/drain regions) are formed prior to the gate replacement process. The contact features have low thermal budgets. Consequently, if the gate replacement processes employ temperatures exceeding the contact features' thermal budget, such as a high temperature annealing process, the contact features are damaged. Accordingly, what is needed is an improved method for fabricating an IC device.

SUMMARY

The present disclosure provides for many different embodiments. An exemplary method for fabricating an integrated circuit device comprises performing a gate replacement process to form a gate structure, wherein the gate replacement process includes an annealing process; after the annealing process, removing portions of a dielectric material layer to form a contact opening, wherein a portion of the substrate is exposed; forming a silicide feature on the exposed portion of the substrate through the contact opening; and filling the contact opening to form a contact to the exposed portion of the substrate.

Yet another exemplary method comprises providing a substrate having a gate structure disposed thereover; replacing a dummy gate of the gate structure with a metal gate; performing a high temperature annealing process to adjust a threshold voltage of the metal gate; and forming a silicide region in the substrate after the high temperature annealing process.

Yet another exemplary method comprises providing a substrate; forming a gate structure over the substrate, wherein the gate structure includes a gate stack having a dummy gate; forming a doped region in the substrate; forming a dielectric material layer over the substrate; removing the dummy gate of the gate structure, thereby forming a trench; and forming a gate in the trench. An annealing process is performed. Thereafter, the method further comprises removing portions of the dielectric material layer to form a contact opening, wherein the doped region in the substrate is exposed; performing a salicidiation process, wherein a contact feature is formed in the doped region through the contact opening; and filling the contact opening to form a contact to the doped region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
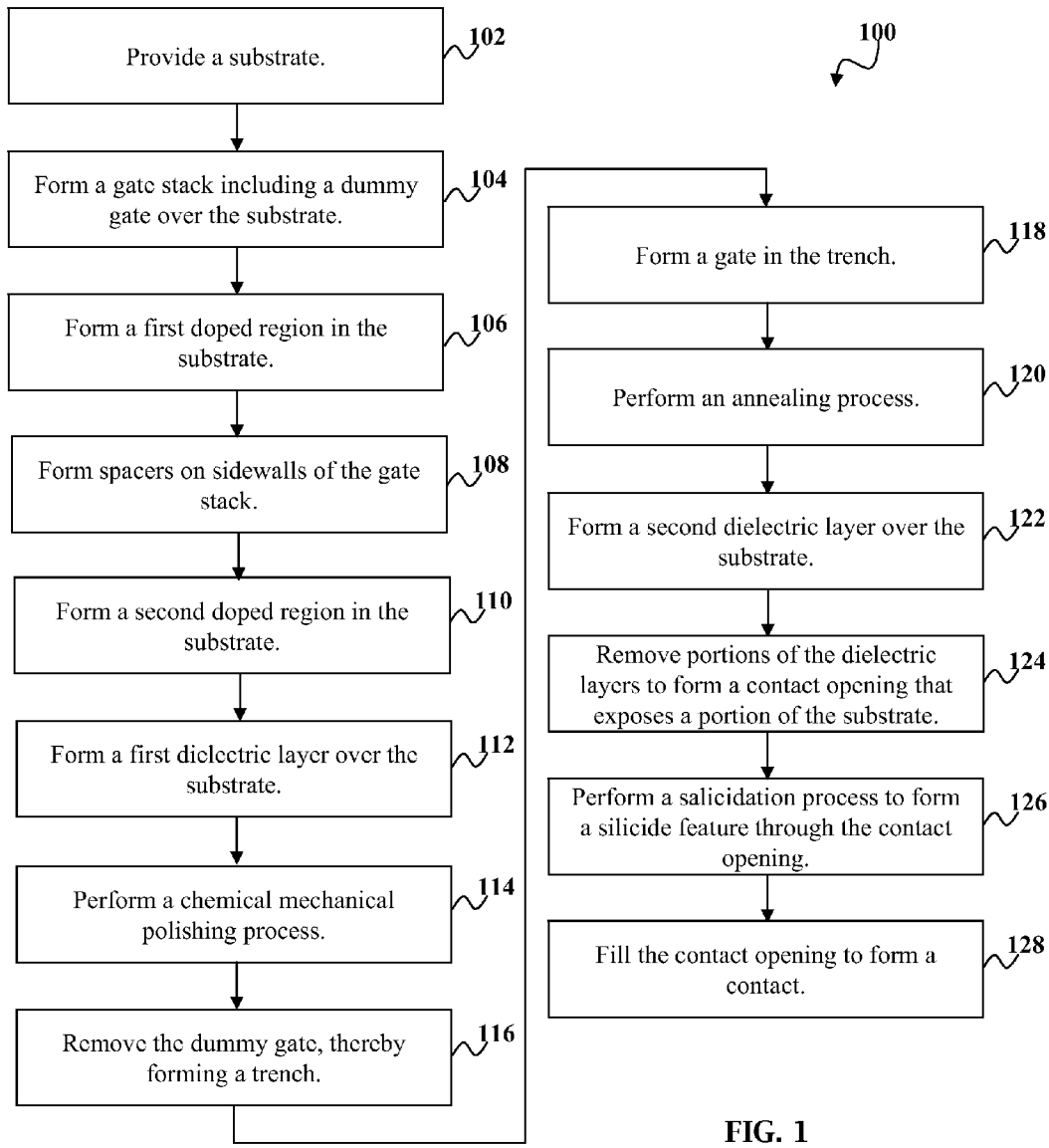
FIG. 1 is a flow chart of a method for fabricating an integrated circuit device according to aspects of the present disclosure.

The present disclosure relates generally to methods for manufacturing integrated circuit devices, and more particularly, to gate replacement processes (or methods).

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2A-2H, method 100 and semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and after the method 100, and some of the steps described below can be replaced or eliminated for additional embodiments of the method. It is further understood that additional features can be added in the semiconductor device 200, and some of the features described below can be replaced or eliminated for additional embodiments of the semiconductor device 200.

FIG. 1 is a flow chart of one embodiment of the method 100 for fabricating the semiconductor device 200 in a "gate last"

process. In the gate last process, a dummy poly gate structure is formed first and then the dummy poly gate structure may be removed and replaced with a metal gate structure. FIGS. 2A-2F are various cross-sectional views of the semiconductor device 200 according to one embodiment, in portion or entirety, during various fabrication stages of the method 100. The semiconductor device 200 may be formed by CMOS technology processing, and thus some processes are not described in detail herein.

Conventional gate replacement processes form silicide features in source/drain regions, before performing a gate replacement process. The silicide features present thermal budget limitations for subsequent processing. More particularly, the silicide features have a low thermal budget, sometimes only able to withstand temperatures less than 500° C. Higher temperatures can damage silicide features, which negatively effects device performance. The low thermal budget limitations constrain subsequent processing, such as the gate replacement process. For example, the low thermal budget limitations limit a temperature of an annealing process used during the gate replacement process. Limiting the annealing temperatures reduces work function tuning of the gate structures.

Accordingly, the method 100 implements a gate replacement process before forming silicide features in contact regions of a substrate, such as silicide in the source/drain regions. Since the gate replacement process and the associated annealing are performed first, the silicide features are formed through a contact opening (i.e., a hole/trench provided to form a contact to the substrate). Performing the gate replacement process first can increase a thermal budget for the annealing processes, which increases the flexibility of using the annealing processes to tune a work function of the gate structure, and accordingly adjust a threshold voltage of the gate structure. Thus, the gate replacement process is not limited by silicide thermal budget limitations. It is understood that different embodiments may have different advantages, and that no particular advantage is necessarily required of any embodiment.

Figure 2A:
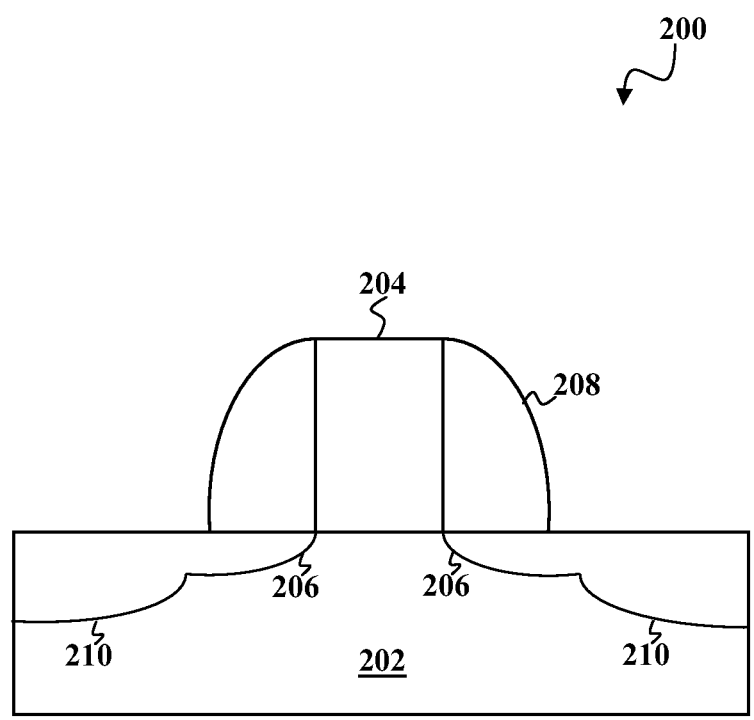
FIGS. 2A-2H are various cross-sectional views of embodiments of an integrated circuit device during various fabrication stages according to the method of FIG. 1.

Referring to FIGS. 1 and 2A, at block 102 of the method 100, a substrate 202 is provided. In the present embodiment, the substrate 202 is a semiconductor substrate comprising silicon. Alternatively, the substrate 202 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 202 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 202, in a P-well structure, in a N-well structure, in a dual-well structure, or using a raised structure. The semiconductor substrate 202 may further include various active regions, such as regions configured for an N-type metal-oxide-semiconductor transistor device (referred to as an NMOS device) and regions configured for a P-type metal-oxide-semiconductor transistor device (referred to as a PMOS device).

The substrate 202 may include an isolation region to isolate various regions (e.g., NMOS and PMOS device regions) of the substrate 202. The isolation region is formed by any suitable process. The isolation region utilizes isolation technology, such as local oxidation of silicon (LOCOS) or shallow trench isolation (STI), to define and electrically isolate the various regions. The isolation region can comprise silicon oxide, silicon nitride, silicon oxynitride, other suitable materials, or combinations thereof.

One or more gate structures are formed over the substrate 202 by any suitable process. In the present example, a gate structure including a gate stack having a dummy gate 204 and spacers 208 is formed over the substrate 202. The gate structure is formed by deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, or ion-beam writing. The etching processes include dry etching, wet etching, and/or other etching methods.

At block 104, the gate stack including dummy gate 204 is formed over the substrate 202 by any suitable process. The gate stack may include gate dielectric layers, capping layers, conductive layers, other suitable layers, and/or combinations thereof. The dummy gate 204 comprises any suitable material. In the present example, the dummy gate 204 comprises silicon oxide, high k dielectric layer and polysilicon. In another example, the dummy gate 204 may comprises silicon oxide and polysilicon on the silicon oxide. In this case, a high k dielectric material is incorporated into the gate in the gate replacement process.

At block 106, a first doped region 206 is formed in the substrate 202. The first doped region 206 is a lightly doped source/drain (LDD) region. The LDD region 206 is formed by one or more ion implantation processes, photolithography processes, diffusion processes, and/or other suitable processes. The LDD region 206 is doped with suitable doping species depending on the type of device being fabricated. The doping species include p-type dopants, such as boron or $BF_2$; n-type dopants, such as phosphorus or arsenic; and/or combinations thereof.

At block 108, the spacers 208 are formed on the sidewalls of the gate stack including the dummy gate 204 by any suitable process. The gate spacers 208 are positioned on each side of the gate stack. The gate spacers 208 comprise a dielectric material, such as silicon nitride, silicon carbide, silicon oxynitride, other suitable materials, and/or combinations thereof. The gate spacers 208 may be used to offset subsequently formed doped regions, such as heavily doped source/drain regions. Forming the spacers 208 may further include forming other features, such as a sealing layer and/or spacer liner.

At block 110, a second doped region 210 is formed in the substrate 202. The second doped region 210 is a source/drain (S/D) region (also referred to as heavily doped S/D (HDD) region). The HDD region 210 is formed by one or more ion implantation processes, photolithography processes, diffusion processes, and/or other suitable processes. The HDD region 210 is doped with suitable doping species depending on the type of device being fabricated. The doping species include p-type dopants, such as boron or $BF_2$; n-type dopants, such as phosphorus or arsenic; and/or combinations thereof. In the present example, the HDD region 210 is aligned with an outer edge of the spacers 208 following the one or more implantation processes. An annealing process, such as a rapid thermal annealing (RTA) and/or laser annealing process, may be performed to activate the LDD region 206 and/or HDD region 210.

In some examples, the HDD region 210 includes raised source and drain regions. Raised S/D regions may be formed by one or more epitaxy processes, such that SiGe or Si features can be formed in a crystalline state in the substrate 202. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 202 (e.g., silicon).

Figure 2B:
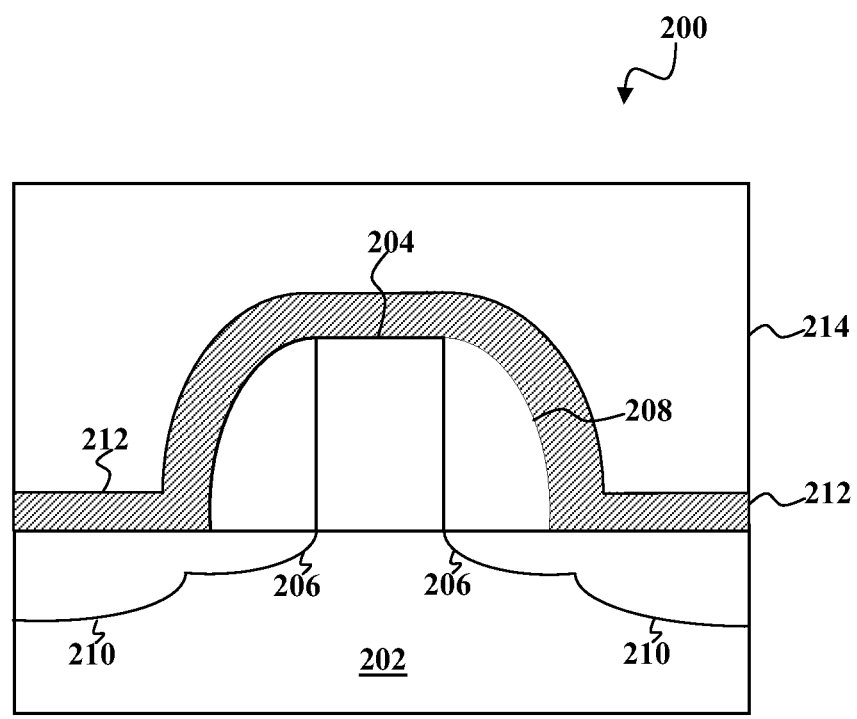

Referring to FIG. 2B, a dielectric material layer is formed over the substrate 202 by any suitable process to any suitable thickness, including over the gate structure. The dielectric material layer may include one or more layers. For example, the dielectric material layer can comprise an etch stop layer (ESL) 212 and a first dielectric layer 214. The ESL 212 comprises silicon nitride, silicon oxynitride, and/or other suitable materials. The composition of the ESL 212 is selected based upon etching selectivity to one or more additional features of the semiconductor device 200. In the present example, ESL 212 is a contact etch stop layer (CESL).

At block 112, the first dielectric layer 214, such as an interlayer (or inter-level) dielectric (ILD) layer, is formed over the substrate 202. The first dielectric layer 214 comprises any suitable dielectric material, such as silicon oxide, silicon nitride, silicon oxynitride, TEOS oxide, phosphosilicate glass (PSG), borophosphosilicate glass (BPSG), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The first dielectric layer 214 may include a multilayer structure comprising multiple dielectric materials.

Figure 2C:
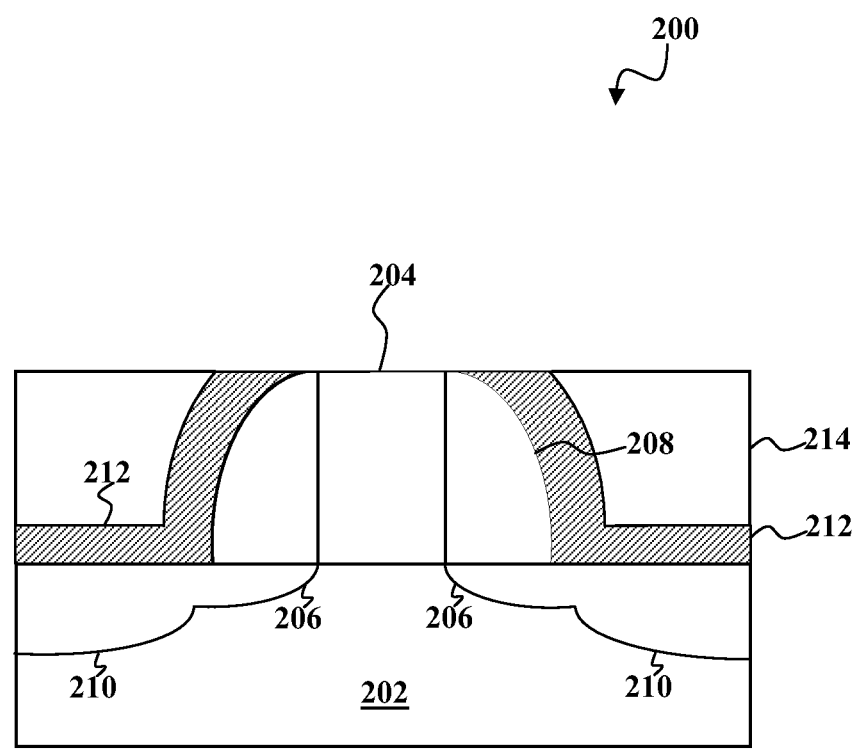

Subsequent to the deposition of the first dielectric layer 214, at block 114, a chemical mechanical polishing (CMP) process may be performed. For example, a CMP process is performed until a top portion of the gate structure, particularly a top portion of the gate stack including the dummy gate 204, is exposed as illustrated in FIG. 2C.

Figure 2D:
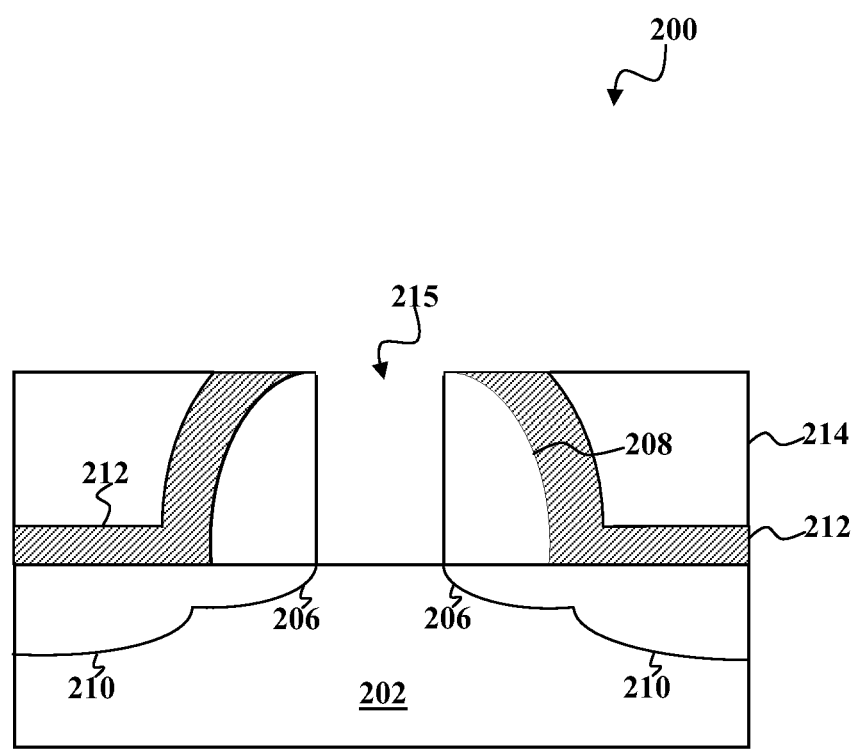
Figure 2E:
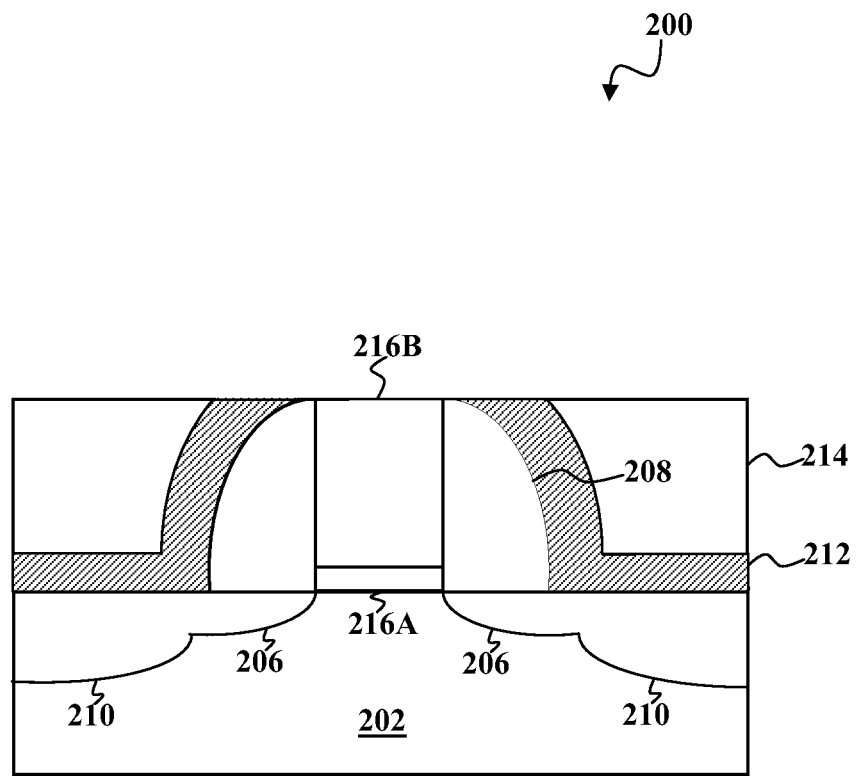

At blocks 116 and 118, a gate replacement process is performed, where the dummy gate 204 is replaced with a gate, such as a metal gate. Referring to FIGS. 2D and 2E, the dummy gate stack is removed, thereby forming a trench (opening) 215 in the gate structure, and a gate 216 is formed in the trench (opening) 215. The dummy gate is removed from the gate structure by any suitable process, such as a dry etching and/or wet etching process. The gate 216 includes gate dielectric 216A and gate electrode 216B. In one example, the gate 216 includes interfacial layers, high k dielectric layer, capping layers, a material layer with a proper work function, conductive layers, other suitable layers, and/or combinations thereof.

The gate dielectric layer 216A comprises a dielectric material, such as silicon oxide, silicon oxynitride, high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, and/or combinations thereof. In one example, the gate dielectric layer 216A includes an interfacial layer such as silicon oxide, and a high k dielectric layer formed on the interfacial layer. The gate dielectric layer can be formed in the dummy gate 204 and remains in the gate 216. Alternatively, the gate dielectric layer can be formed in the gate replacement process.

The gate electrode 216B is formed over the gate dielectric layer 216A by any suitable process. The gate electrode 216B may include a conductive layer having a proper work function or tuned to the proper work function (therefore also referred to as a work function layer). In various examples, the work function layer includes tantalum, tantalum nitride, nickel silicide, cobalt silicide, TiN, WN, TiAl, TiAlN, TaCN, TaC, TaSiN, other suitable material, or combination thereof. The gate electrode 216B further comprises a conductive material layer formed on the work function layer using a suitable conductive material, such as aluminum, tungsten, or copper. The conductive material layer may additionally or collectively include polysilicon, titanium, tantalum, metal alloys, other suitable materials, and/or combinations thereof.

At block 120, an annealing process, such as a rapid thermal annealing (RTA), is performed for any suitable time. The annealing process is a high temperature annealing process. For example, the annealing process employs a temperature greater than or equal to 550° C. In an example, the temperature ranges from about 550° C. to about 800° C. The annealing process can be used to adjust a threshold voltage of the gate structure and/or tune a work function of the gate structure. As noted herein, because a silicide feature for the S/D regions (e.g., HDD region 210) will be formed after the annealing process, the annealing process is not limited by silicide thermal budget limitations. High temperature annealing processes can be utilized without concern about damaging or negatively affecting the contact feature (or silicide), providing a wider replacement gate process window, particularly expanding the ability to tune various work functions. Thus, the annealing process parameters may be selected depending on the work function (or threshold voltage) desired.

At block 122, a second dielectric layer 218, such as an interlayer (or inter-level) dielectric (ILD) layer, is disposed over the substrate 202. In the present example, the second dielectric layer 218 is formed over the first dielectric layer 214. The second dielectric layer 218 comprises any suitable dielectric material and may be similar to the first dielectric layer 214. It is understood that the second dielectric layer 218 may be considered a part of the dielectric material layer, and thus, in the present example, the dielectric material layer comprises the ESL 212, first dielectric layer 214, and second dielectric layer 218.

Figure 2F:
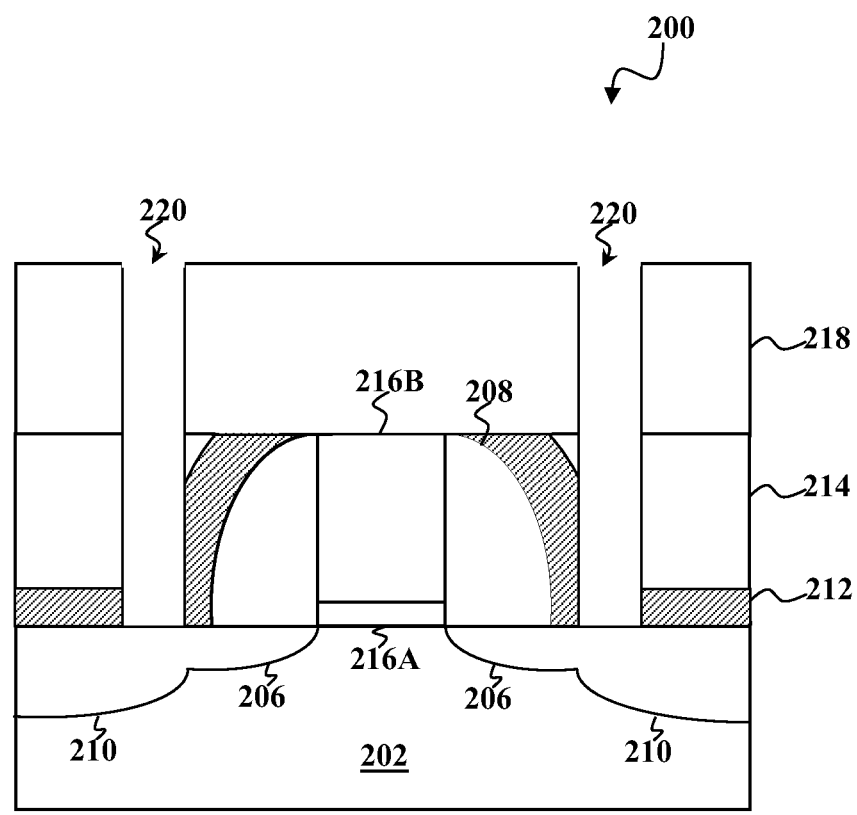

Referring to FIG. 2F, portions of the material layer are removed to form a contact opening that exposes a portion of the substrate 202. In the present example, at block 124, portions of the ESL 212 and dielectric layers (e.g., first and second dielectric layers 214, 218) are removed to form a contact opening 220. As illustrated, the contact opening exposes the substrate 202, particularly, a portion of the HDD doped region 210 (S/D region). Removing the dielectric material layer comprises any suitable process. For example, various etching processes, such as dry and/or wet etching processes may be utilized. Removing dielectric material layer also includes a lithography patterning process to form a patterned resist layer defining the contact opening.

Figure 2G:
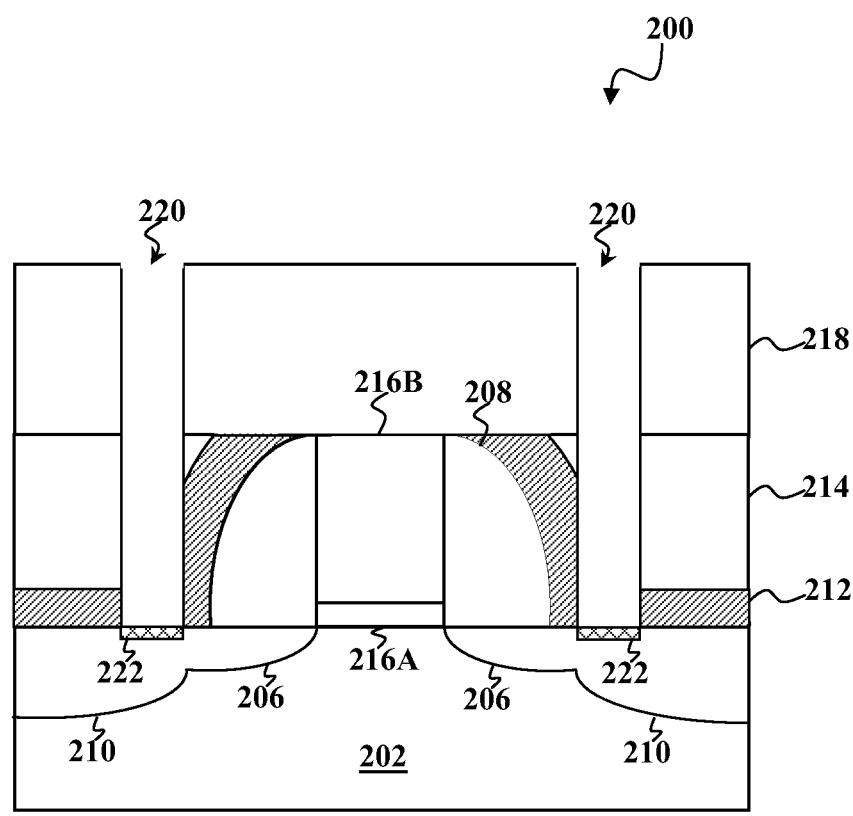

Then, at block 126, a salicidation process is performed. The salicidation process forms a silicide (contact) feature 222 through the contact opening 220 as illustrated in FIG. 2G. In the present example, the silicide feature 222 is formed in the substrate 202, coupled to the HDD region 210. In one embodiment, the contact feature 222 comprises nickel silicide (NiSi). In furtherance of the embodiment, if the annealing process applied to the NiSi is beyond a thermal budget, the NiSi can be turned into a higher resistivity phase, which degrades the performance of the device. The silicide material may alternatively include NiSi, nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable silicide materials, and/or combinations thereof.

The contact feature 222 is formed by any suitable process, such as a salicide (self-aligned silicide) process. For example, a metal material may be deposited over the substrate, including over the doped regions. After deposition, the salicidation process may continue with a reaction between the deposited metal material and the silicon regions at an elevated temperature. The elevated temperature may be selected based on the specific metal material or materials. This is also referred to as annealing, which may be a RTA process. The unreacted metal material is removed thereafter. The reacted silicide may require additional thermal process to reduce the resistance of the silicide.

Figure 2H:
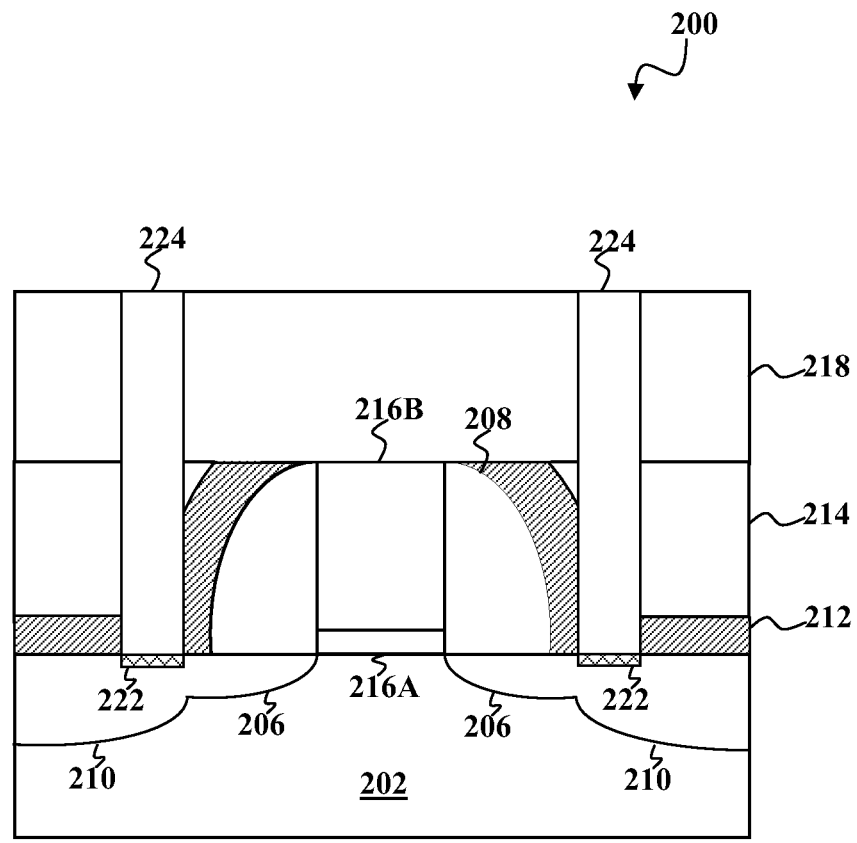

Referring to FIG. 2H, at block 128, a contact 224 is formed in the contact opening 220 by any suitable process. Contact 224 provides contact to the HDD region 210 (via the contact feature/silicide region 222). In the present example, the contact 224 is formed by filling the contact opening 220 with a conductive material. The conductive material comprises any suitable material, such as tungsten, aluminum, copper, tungsten, titanium, tantulum, titanium nitride, tantalum nitride, nickel silicide, cobalt silicide, other suitable materials, and/or combinations thereof.

Subsequently, the semiconductor device 200 may undergo further CMOS technology processing to form various features known in the art. Subsequent processing may form additional contacts, various vias/lines, and multilayer interconnect features (e.g., metal layers and interlayer dielectrics) over the substrate 202, configured to connect the various features or structures of the semiconductor device 200. The additional features may provide electrical interconnection to the device including the formed metal gate structure. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene, such as a dual damascene process, is used to form a copper related multilayer interconnection structure over the substrate 202.

In summary, a high temperature gate replacement process is provided. The high temperature gate replacement process implements an annealing process before formation of contact features, such as silicide regions of the source/drain regions. Instead of forming the silicide features prior to the gate replacement process, the contact features are formed through a contact opening, which are formed after the gate replacement process to provide contact to the substrate and devices formed therein/thereon. Consequently, the annealing process of the gate replacement process is not limited by contact feature (silicide) thermal budget limitations. The gate replacement process window is increased, allowing high annealing temperatures for work function tuning. Accordingly, annealing temperatures greater than about 550° C. can be utilized for adjusting a threshold voltage (or work function) of the gate structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for fabricating an integrated circuit device, the method comprising:
   providing a substrate;
   forming a gate structure that includes a dummy gate over the substrate;
   forming a heavily doped source/drain feature in the substrate adjacent the dummy gate;
   after forming the heavily doped source/drain feature in the substrate adjacent the dummy gate, forming a first interlevel dielectric layer over the substrate including over the gate structure, such that the dummy gate is exposed, wherein the first interlevel dielectric layer completely covers the heavily doped source/drain feature;
   performing a gate replacement process that replaces the dummy gate of the gate structure with a gate, wherein the gate replacement process includes a first annealing process, wherein the first interlevel dielectric layer completely covers the heavily doped source/drain feature while performing the gate replacement process;
   after the first annealing process, forming a second interlevel dielectric layer over the first interlevel dielectric layer;
   removing portions of the first interlevel dielectric layer and the second interlevel dielectric layer to form a contact opening that extends through the first interlevel dielectric layer and the second interlevel dielectric layer to expose a portion of the substrate;
   forming a silicide feature on the exposed portion of the substrate through the contact opening that extends through the first interlevel dielectric layer and the second interlevel dielectric layer, wherein forming the silicide feature includes depositing a metal layer on the exposed portion of the substrate and performing a second annealing process to form the silicide feature; and
   filling the contact opening to form a contact to the exposed portion of the substrate.

2. The method of claim 1 wherein performing the first annealing process comprises employing a temperature greater than or equal to 550° C.

3. The method of claim 1 wherein forming the silicide feature on the exposed portion of the substrate comprises forming a nickel silicide (NiSi) feature in a source/drain region of the substrate.

4. The method of claim 1 wherein forming the silicide feature comprises forming a silicide material selected from the group consisting of nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), and combinations thereof.

5. The method of claim 1 wherein filling the contact opening to form the contact to the substrate comprises depositing a conductive material to fill the contact opening.

6. The method of claim 1 wherein performing the gate replacement process comprises:
removing the dummy gate, thereby forming a trench; and
depositing a gate dielectric layer and a gate electrode in the trench.

7. A method for fabricating an integrated circuit device, the method comprising:
providing a substrate having a gate structure disposed thereover, wherein the gate structure interposes a lightly doped source feature and a lightly doped drain feature formed in the substrate, and further wherein the gate structure includes a dummy gate and spacers disposed along sidewalls of the dummy gate;
forming a heavily doped source feature and a heavily doped drain feature in the substrate adjacent the dummy gate;
forming a first interlevel dielectric layer over the substrate such that the first interlevel dielectric layer completely covers one of the heavily doped source feature and the heavily doped drain feature;
after forming the heavily doped source feature and the heavily doped drain feature in the substrate adjacent the dummy gate, replacing the dummy gate of the gate structure with a metal gate, wherein the first interlevel dielectric layer completely covers the one of the heavily doped drain feature and the heavily doped drain feature while replacing the dummy gate of the gate structure with the metal gate;
performing a process where a high temperature annealing process is performed to adjust a threshold voltage of the metal gate before forming silicide features coupled to the heavily doped source feature and the heavily doped drain feature, wherein the process includes:
thereafter performing the high temperature annealing process, forming an opening in a dielectric layer disposed over the substrate, wherein the opening exposes the heavily doped source feature and the heavily doped drain feature, wherein the opening defines a location of a contact to the heavily doped source feature and the heavily doped drain feature;
thereafter, forming the silicide feature in the heavily doped source feature and the heavily doped drain feature of the substrate through the opening; and
thereafter, filling in the opening with a conductive material to form the contact to the heavily doped source feature and the heavily doped drain feature.

8. The method of claim 7 wherein the forming the opening in the dielectric layer disposed over the substrate includes forming the opening in a portion of the first interlevel dielectric layer.

9. The method of claim 8 further comprising forming a second interlevel dielectric layer over the first interlevel dielectric layer after performing the high temperature annealing process, wherein the forming the opening in a portion of the first interlevel dielectric layer includes forming an opening that extends through the first interlevel dielectric layer and the second interlevel dielectric layer.

10. The method of claim 7 wherein performing the high temperature annealing process comprises utilizing a temperature greater than or equal to 550° C.

11. A method for fabricating an integrated circuit device, the method comprising:
providing a substrate;
forming a gate structure over the substrate, wherein the gate structure includes a gate stack having a dummy gate and spacers disposed along sidewalls of the gate stack;
forming a heavily doped source/drain feature in the substrate adjacent the dummy gate;
after forming the heavily doped source/drain feature in the substrate adjacent the dummy gate, forming a first interlevel dielectric (ILD) layer over the substrate including over the gate structure that includes the gate stack having the dummy gate and the spacers disposed along sidewalls of the gate stack, wherein the forming the ILD layer includes polishing the ILD layer to expose a top portion of the dummy gate of the gate structure, wherein the first ILD layer completely covers the heavily doped source/drain feature;
completely removing the dummy gate of the gate structure, thereby forming a trench that exposes a portion of the substrate;
after completely removing the dummy gate of the gate structure, forming a high-k dielectric material layer on the exposed portion of the substrate within the trench;
forming a gate in the trench, wherein the first ILD layer completely covers the heavily doped source/drain feature while forming the gate in the trench;
after forming the gate, performing an annealing process;
after the annealing process, forming a second ILD layer over the first ILD layer;
removing portions of the first ILD layer and the second ILD layer to form contact openings that extend through the first ILD layer and the second ILD layer and expose the heavily doped source/drain feature;
performing a salicidation process to form a silicide feature in the heavily doped source/drain feature through the contact openings; and
filling the contact openings to form contact to the heavily doped source/drain feature.

12. The method of claim 11 wherein performing the annealing process comprises performing a high temperature annealing process, wherein an annealing temperature is from about 550° C. to about 800° C.

13. The method of claim 11 wherein performing the annealing process comprises selecting an annealing temperature to achieve at least one of a work function characteristic or a threshold voltage characteristic of the gate.

14. The method of claim 13 wherein selecting an annealing temperature comprises choosing a temperature greater than or equal to about 550° C.

15. The method of claim 11 wherein performing the annealing process comprises utilizing a rapid thermal annealing (RTA) process.

16. The method of claim 11 wherein performing the salicidation process to form the silicide feature in the heavily doped source/drain feature through the contact openings comprises forming a nickel silicide (NiSi) in the heavily doped source/drain feature.

17. The method of claim 11, further comprising forming an etch stop layer over the heavily doped source/drain feature such that the etch stop layer physically contacts and completely covers the heavily doped source/drain feature, and wherein the etch stop layer physically contacts and completely covers the heavily doped source/drain feature while forming the gate in the trench.

18. The method of claim 1, wherein performing the gate replacement process that replaces the dummy gate of the gate structure with the gate includes:
completely removing the dummy gate of the gate structure to form a trench that exposes a portion of the substrate;
forming a high-k dielectric material layer directly on the exposed portion of the substrate; and
forming a gate electrode on the high k dielectric material layer.

19. The method of claim 1, furthering comprising forming an etch stop layer directly over and completely covering the heavily doped source/drain feature, and
wherein the etch stop layer is directly over and completely covering the heavily doped source/drain feature while performing the gate replacement process.

20. The method of claim 1, wherein the first annealing process is performed at a first temperature that will tune the gate structure to a desired work function, and
wherein the second annealing process is performed at a second temperature that is different than the first temperature.

* * * * *